US00RE39418E

(19) United States
(12) Reissued Patent
Pfaff

(10) Patent Number: US RE39,418 E
(45) Date of Reissued Patent: *Dec. 5, 2006

(54) MOUNTING APPARATUS FOR BALL GRID ARRAY DEVICE

(75) Inventor: Wayne K. Pfaff, Irving, TX (US)

(73) Assignee: Plastronics Socket Partners, L.P., Irving, TX (US)

( * ) Notice: This patent is subject to a terminal disclaimer.

(21) Appl. No.: 09/715,290

(22) Filed: Nov. 17, 2000

Related U.S. Patent Documents

Reissue of:
(64) Patent No.: 5,611,705
Issued: Mar. 18, 1997
Appl. No.: 08/382,487
Filed: Feb. 1, 1995

U.S. Applications:
(63) Continuation-in-part of application No. 08/258,348, filed on Jun. 10, 1994, now Pat. No. 5,419,710.

(51) Int. Cl.
*H01R 11/22* (2006.01)

(52) U.S. Cl. ..... 439/266; 439/342
(58) Field of Classification Search ..... 439/54, 439/68–71, 83, 260–268, 593, 832, 847–850, 439/912, 342
See application file for complete search history.

(56) References Cited

U.S. PATENT DOCUMENTS 4,420,205 A * 12/1983 Kirkman ..... 439/266
4,739,257 A * 4/1988 Jenson et al. ..... 324/763
5,073,117 A * 12/1991 Malhi et al. ..... 439/71
5,281,160 A * 1/1994 Walkup et al. ..... 439/266

* cited by examiner

*Primary Examiner*—Khiem Nguyen
(74) *Attorney, Agent, or Firm*—Mark W. Handley; Chauza & Handley, L.L.P.

(57) ABSTRACT

Ball grid array devices are mounted in [a] burn-in and test [socket which has a top surface] *sockets which have top surfaces* with windows for the [ball terminals] *terminal balls* depending from the ball [grad] *grid* array device. Contact fingers mounted on the base of the socket extend through a bending plate and into the windows from the opposite side of the top surface. When the bending plate is moved laterally with respect to the top surface, the ends of the contact members are moved into contact with the [ball terminals] *terminal balls*. The ends of the contact members are urged into contact with the [ball terminals] *terminal balls* between the center of the [ball] *terminal ball* and the surface of the ball grid array device, thus retaining the device in the socket.

55 Claims, 7 Drawing Sheets

10
11
12
12

23
23a
42
23
23a
42
24
42

10
11
52
35
2
24
35
2
53
50
100

MOUNTING APPARATUS FOR BALL GRID ARRAY DEVICE

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application is a continuation of application Ser. No. 09/166,238 filed Oct. 5, 1998, now abandoned for reissue of U.S. Pat. No. 5,611,705, issued Mar. 18, 1997 to Wayne K. Pfaff.*

This application is a continuation-in-part of application Ser. No. 08/258,348 filed Jun. 10, 1994, entitled Mounting Apparatus for Ball Grid Array Device, now U.S. Pat. No. 5,419,710.

This invention relates to electronic device mounting and testing apparatus. More particularly, it relates to socket apparatus for holding and making electrical contact with the input/output terminals of ball grid array devices during testing, burn-in and the like.

Advances in microelectronics technology tend to develop device chips which occupy less space while performing more functions. As a result, the number of electrical interconnections between the chip and external circuitry required for the circuit in the chip to communicate with the outside world increases and the physical size of each such interconnection must decrease. In order to provide electrical communication between the chip and external circuitry, circuit chips are usually contained within a housing or package which supports interconnection leads, pads, etc., on one or more of its external surfaces. In order to reduce overall lead length from chip to external circuitry and to provide adequate spacing between input/output terminals on the package, high pin count devices are usually mounted in packages in which the input/output terminals are arranged in a grid pattern on one face of the package. The terminals may be in the form of pins extending from the package (usually described as a pin grid array or PGA) or contact pads on the surface of the package. To physically secure the chip to a substrate and provide electrical connection between its terminal pads and similar interconnect pads on the surface of a substrate such as a circuit board or the like on which the package is to be mounted, a small drop or ball of solder or the like is secured to each terminal pad on the device package. Since the solder drop forms a ball-like protrusion extending from the terminal pad, such devices are ordinarily described as ball grid array (or BGA) devices.

While the term "ball grid array device" is usually applied to a device package which has substantially spherical contacts extending from one face thereof, the term is also applied to other structures. For example, bare (unencapsulated) chips are sometimes provided with a grid array of ball-shaped contacts for mounting in a package. However, at some point during fabrication, the bare chip with ball-shaped contacts is fairly described as a ball grid array device. Similarly, finished chips are sometimes provided with terminal pads on one surface with ball-like deposits of solder forming interconnections on the terminal pads. The chip is then inverted and attached directly to a corresponding pattern of interconnect pads on a substrate. When heated, the solder balls reflow forming electrical and physical connections. This process (sometimes referred to as "flip-chip" technology) obviously uses devices which may be described as ball grid array devices. Accordingly, for purposes of this disclosure the terms "ball grid array" and "ball grid array device" mean any structure, including device packages, flip chips and bare dies, carrying a plurality of substantially ball-shaped interconnections on one face thereof which are arranged in a substantially grid-like pattern. The ball terminals are substantially spherical and are arranged on one face of the device package in a predetermined pattern. Since the ball terminals are substantially spherical and uniform in size, each ball terminal has a geometric center which is spaced from the surface of the device package from which the ball terminal depends and the geometric centers of the ball terminals lie substantially in a plane parallel with the surface of the device package from which the [ball terminals] *terminal balls* depend. This plane (or the corresponding plane for each individual [ball] terminal *ball*) is referred to herein as the center, centerline or extended centerline of the [ball] terminal *ball*.

Many electronic devices are subjected to testing and burn-in at some point during or after the fabrication process. For burn-in and testing, the device must be removeably mounted on a test fixture which provides electrical connection with each of the input/output terminals while the device is functionally tested and evaluated. In many cases the device is subjected to harsh environmental conditions (such as heat, etc.)as well as electrical stresses to evaluate and assure full functionality of the finished device. In order to provide for effective testing and burn-in, the fixture in which the device is mounted for testing and burn-in must permit rapid and easy insertion and removal without damage to the device, the device package or the delicate [ball terminals] *terminal balls*. However, the very features of the ball grid array device which make it attractive as a device structure (i.e., closely grouped very small contacts arranged on a hidden face) make it extremely difficult to reliably mount in a test socket without damaging the device structure.

In conventional test structures the ball grid array device is positioned on an interconnect substrate having interconnect pads in an array corresponding to the ball grid array pattern. The ball grid array device is positioned on the substrate so that the terminal balls are individually in contact with interconnect pads on the test substrate. However, to maintain the ball grid array device in the proper position and orientation for testing, a lid or cover must be used which entraps the device and maintains the ball grid array in register and contact with the interconnect pads. Unfortunately, the entrapping lid interferes with proper circulation of cooling air around the device and precludes use of heat sinks even though the device may be designed to operate only in connection with a particular heat sink. Such lids or covers are also difficult to manipulate, may cause damage to the device and generally prevent automated loading and unloading of the test sockets.

The present invention avoids the difficulties of the prior art by providing a mounting housing or socket with an open top. No lids, covers, etc., are required. Thus the top face of the device under test is available for attachment of a heat sink or open to cooling air or the like. Furthermore, since the top of the socket or mounting housing is open, devices to be tested can be inserted and removed by automated processes without fear of damaging the devices or the mounting apparatus.

The socket or mounting [housing] *housings* of the invention [comprises a support member having a top face with a plurality of] *include support members with* windows arranged therein to receive the array of interconnection terminal balls depending from the face of a ball grid array package. The socket also includes a base member in which a plurality of axially elongated contact pins or fingers are anchored. One end of each contact finger extends through the base to provide an attachment tail which may be soldered to a burn-in board or the like. The opposite end of each finger projects into one of the windows. The central portion of each finger (between the free end and the base) extends through an aperture in a bending plate mounted between the base and the support member. The bending plate may be fixed or moveable laterally with respect to the support member to move the free ends of the contact fingers with respect to the windows. The end portion of each free end is curved or bent to define a contact tip at the extreme end of the free end which deviates from the axis of the finger. The fingers are mounted so that in the open configuration the free end portions of the contact fingers [are adjacent one side of their respective windows] *extend into a window*. When a ball grid array device is positioned on the top face of the support member, the terminal balls project or depend into the windows. In the preferred embodiment, a cam is used to move the bending plate laterally, thus simultaneously and uniformly moving the free ends of all the contact fingers in the same direction. The end portions are thus urged into contact with the terminal balls occupying the windows. The extreme portion of each finger (which is deviated from the axis of the finger) is positioned adjacent the top of the window. Thus, when the finger is moved by the bending plate, the end contacts the terminal ball above the horizontal centerline thereof. The fingers thus provide individual electrical contact to each ball and, since they contact the balls above their centerlines (between the center of each ball and the device face from which it depends), they retain the balls in [their respective windows] *the window* and thus entrap the ball grid array device. Since the ball grid array device is held in place by the end portions which contact the balls above their centerlines, the size of the balls may vary within limits without affecting the trapping effect of the contact fingers. Because of the simplicity of design and operation, the socket devices of the invention may be made from a wide variety of available materials. Since the top of the socket is open, automated processes may be employed to load and unload the socket without damage to the devices or the sockets and the top surface of the device is exposed for cooling and/or attachment of a heat sink. Other features and advantages of the invention will become more readily understood from the following detailed description taken in connection with the appended claims and attached drawing in which:

Figures 1, 1A, 1B:
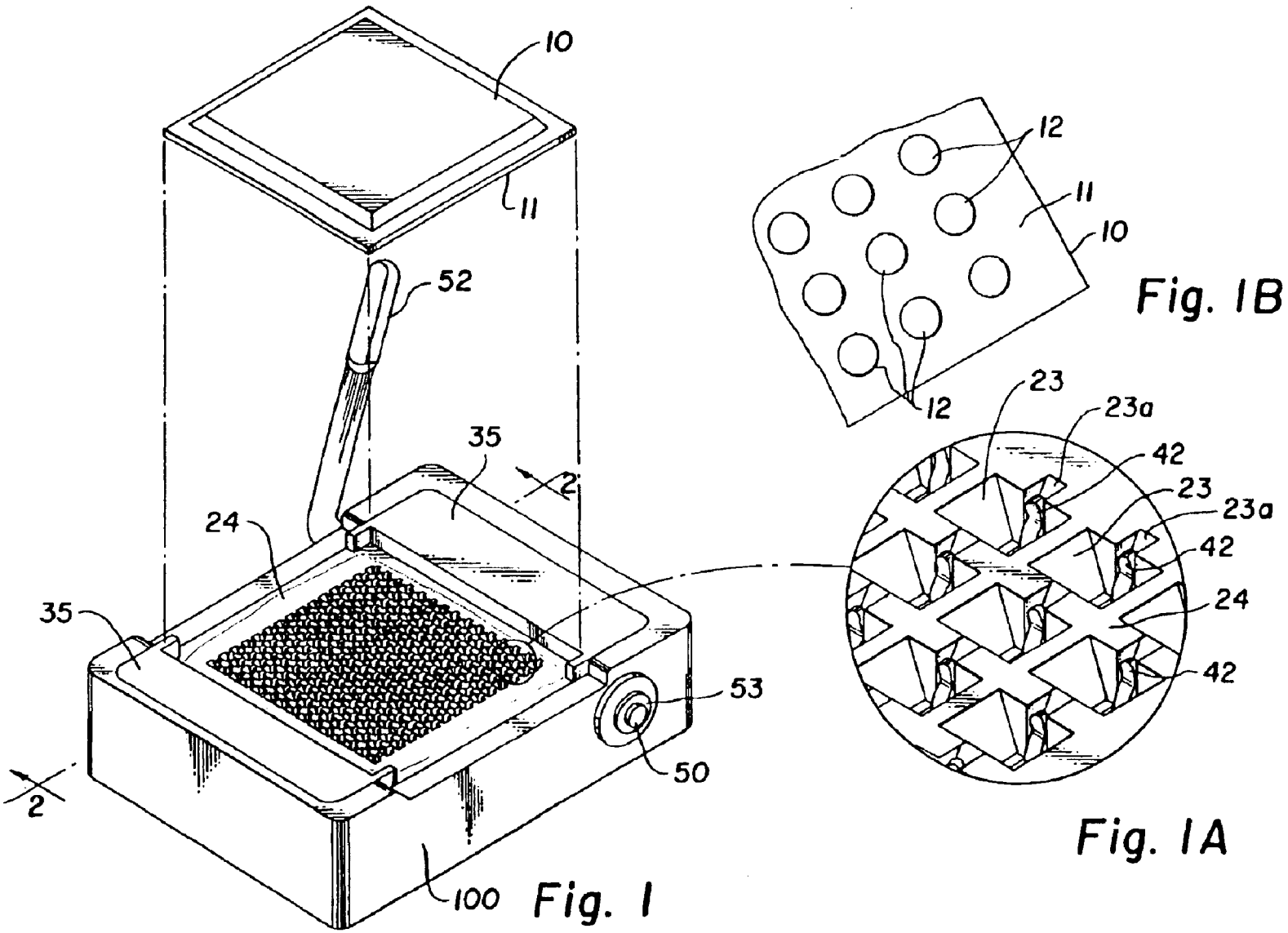
FIG. 1 is an exploded perspective view of the assembly of a ball grid array device with a preferred embodiment of the mounting housing of the invention.
FIG. 1A is an exaggerated fragmentary view of the top surface of the mounting housing of FIG. 1.
FIG. 1B is an exaggerated fragmentary view of the ball grid array surface of the ball grid array device of FIG. 1.
Figure 6:
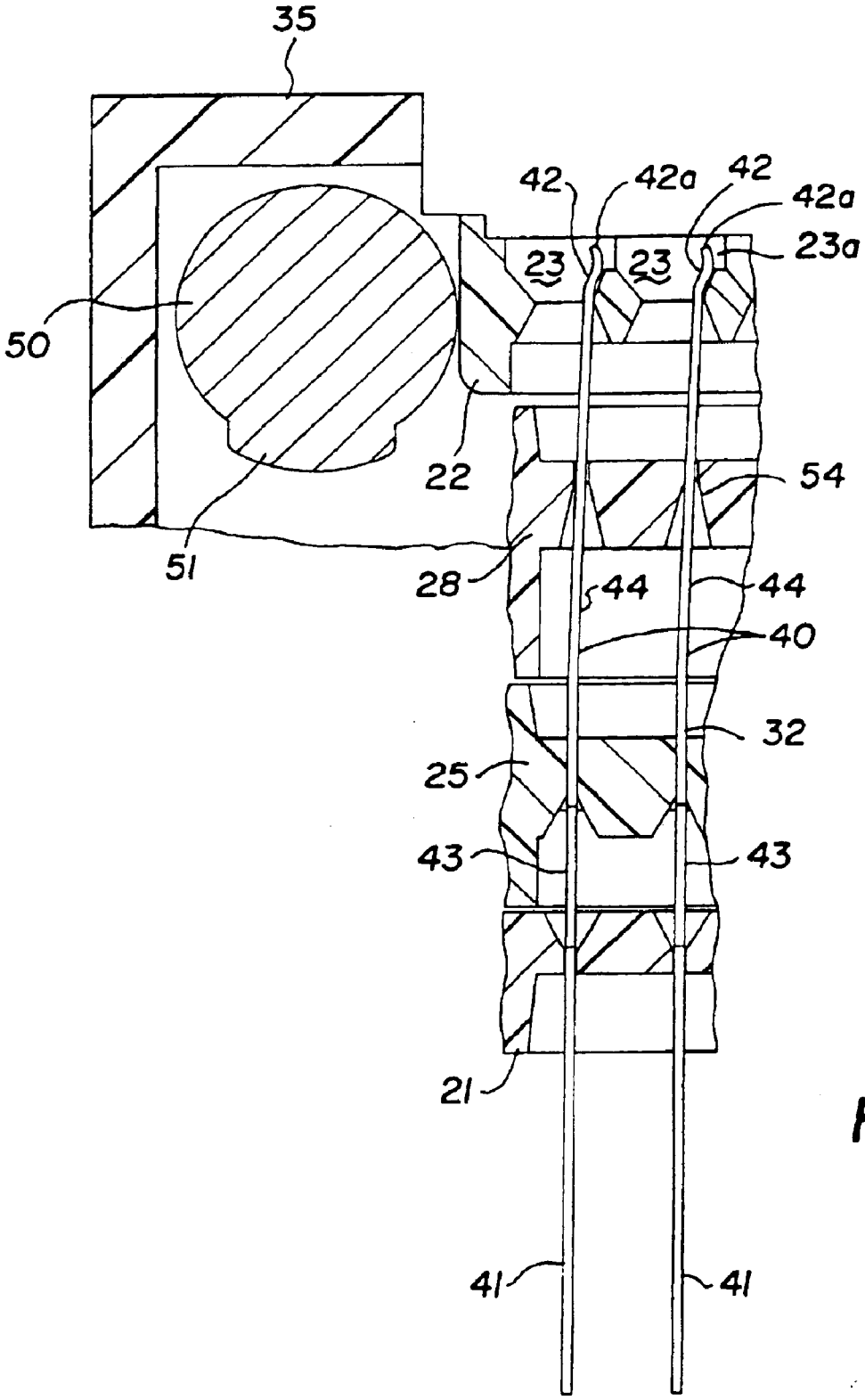
Figure 7:
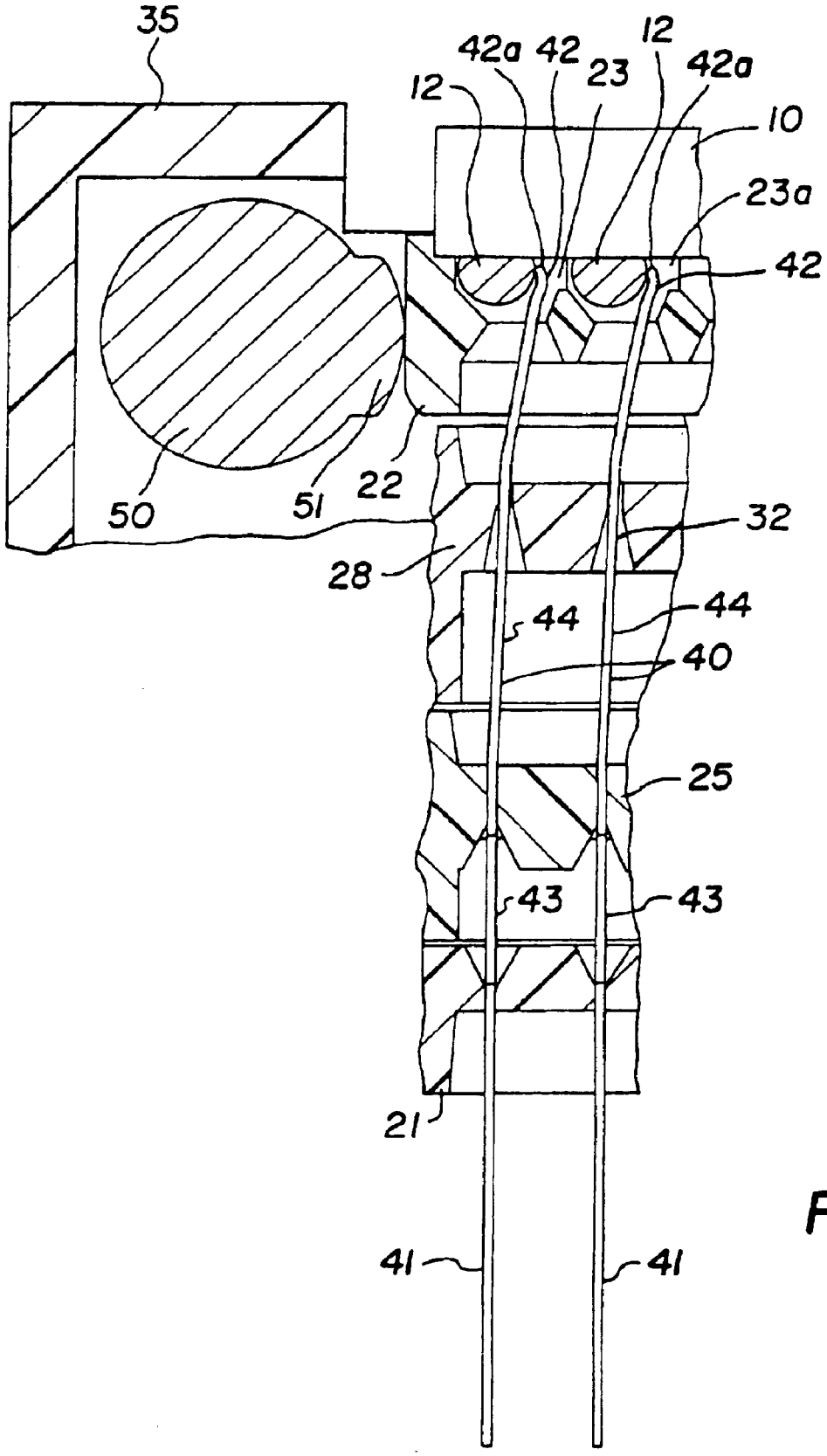

FIG. 6 is a partial sectional view of an alternative embodiment of a mounting housing device as shown in FIG. 1 wherein the bending plate is maintained stationary and the top support member is used to move the ball grid array device with respect to the contact fingers; and FIG. 7 is a partial sectional view of the device of FIG. 6 showing the relative portions of the ends of the contact fingers and the ball grid array device when the socket is in the closed position.

The terms "mounting housing" and "socket" are used synonymously herein to describe a device or apparatus for holding a ball grid array device while providing electrical contact to each of its terminal balls. For clarity of illustration, like numerals are applied to like parts throughout the drawing.

Operational arrangement of a ball grid array device 10 with the mounting housing of the invention is illustrated in FIG. 1. The ball grid array of device 10 has a bottom face 11 (see FIG. 1B) on which are formed a plurality of spherically-shaped terminals 12. The terminals 12 are formed by depositing solder at predetermined locations on mounting pads or the like (not illustrated) on the face 11 of the device. Various methods for forming such terminal balls are known and form no part of this invention. Such processes ordinarily produce substantially spherical bodies (see FIG. 5) which depend from the lower face 11 of the ball grid array device. The terminal balls 12 are usually solder which has been deposited and heated so that it contracts into a ball shape by surface tension. Regardless of the method of manufacture, for reference purposes the ball-shaped terminals extending from the face of the ball grid array device are referred to herein as terminal balls or ball terminals.

Terminal balls 12 are arranged on the lower face of ball grid array device 10 in a predetermined grid-like pattern. To accommodate the ball grid array device, the mounting housing of the invention employs a top support member 22 which has a plurality of windows 23 extending therethrough (*see FIG. 1A*). [The] *As shown in FIG. 1A the* windows 23 are arranged in a grid pattern matching the grid pattern of the [ball terminals] *terminal balls* 12. *As shown in FIGS. 2, 3, 6 and 7 top support member 22 defines a single window into which all the terminal balls depend and into which the contact fingers extend with their ends arranged in a grid pattern matching the grid pattern of the terminal balls 12.* To accommodate ball grid array devices of different dimensions, the top face 24 of support member 22 may be provided with removeable spacers 35 of various sizes. The spacers 35 define the periphery of each particular ball grid array device and position the ball grid array device to prevent movement thereof laterally with respect to top face 24. Spacers 35 therefore assure that each ball grid array is aligned with the [ball terminals] *terminal balls* 12 depending from the lower face 11 thereof in proper registry and orientation with windows 23 and may be changed as required for each size and shape of ball grid array device package.

In the [preferred] embodiment illustrated in FIG. 1 the socket of the invention is formed of a plurality of plate-like components (described in detail hereinafter) contained within a unitary box-like housing 100 having an open top and open bottom. As illustrated in *the embodiment of* FIGS. 2, 3 and 4 the housing contains a base member 21 which has a plurality of apertures 30 therein positioned substantially in registry with windows 23 in support member 22. Each aperture 30 has an internal shoulder 31 (see FIG. 4). An elongated contact finger 40 is positioned in each aperture 30. In the preferred embodiment, each elongated contact finger defines an axially elongated body of resilient electrically conductive material such as nickel-coated steel or the like. The mid-section 43 of each contact finger 40 is substantially widened to form shoulders 45 and 46 on opposite ends thereof. Accordingly, when contact fingers 40 are inserted in the base member 21, tail portions 41 project through apertures 30 and shoulders 46 rest on shoulders 31. Trap plate 25 having apertures 32 and shoulders 33 in registry with and corresponding to apertures 30 is secured to base member 21 and shoulders 33. The upper portion 44 of each contact finger 40 extends through an aperture 32 and the shoulders 33 on aperture 32 contact shoulders 45 on the expanded mid-sections 44 of the contact fingers. Accordingly, the contact fingers 40 are securely entrapped and held in place in the base member 21 by trap plate 25.

The lower ends of the contact fingers 40 extend from the lower face of base support 22 to define input/output tails 41. Tails 41 may be secured in a suitable circuit board, burn-in board or the like. Alternatively, other means for making electrical contact to the circuitry of the supporting medium may be used.

The upper portion 44 of each contact finger 40 which extends above the mid-section 43 projects through an aperture 54 in bending plate 28 with its free end 42 terminating in window 23. In the preferred embodiment, the free end portion 42 of each finger 40 is sufficiently elongated to define a generally central axis which is substantially perpendicular to the support surface 24 and extends into [a] window 23. The extreme end 42a, however, is bent or curved to deviate from the central axis and extends into the window 23 toward the support surface 24 but does not extend through the window 23 or surface 24. For best results, the extreme end 42a should extend as near the surface 24 as possible without extending therethrough. It is only necessary, however, that the extreme end 42a be above the centerline of the ball terminal which it contacts.

Figure 2:
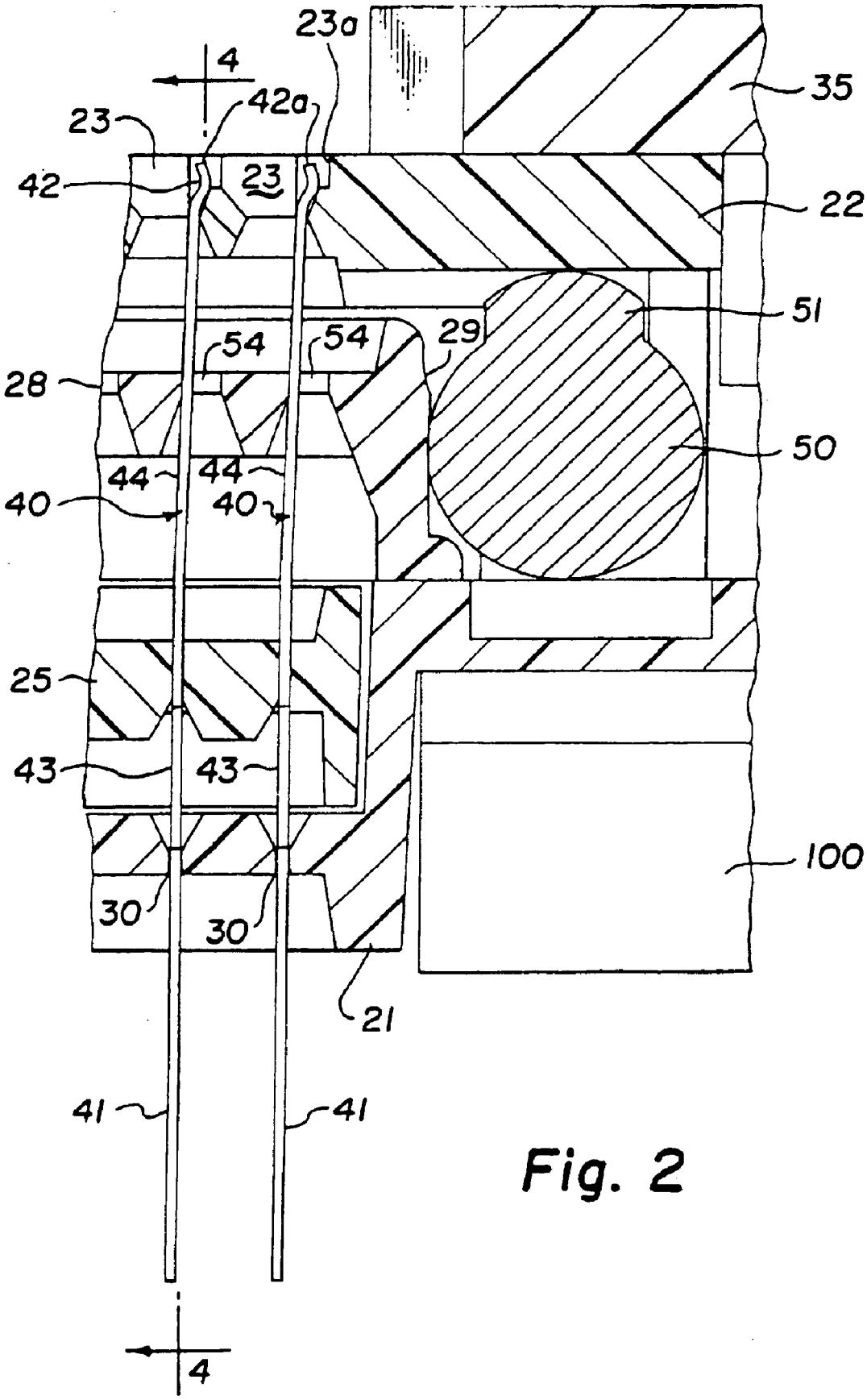
FIG. 2 is a partial sectional view of the mounting housing device of FIG. 1 taken along lines 2—2 showing the position of the contact fingers when the mounting housing is in the open condition.
Figure 3:
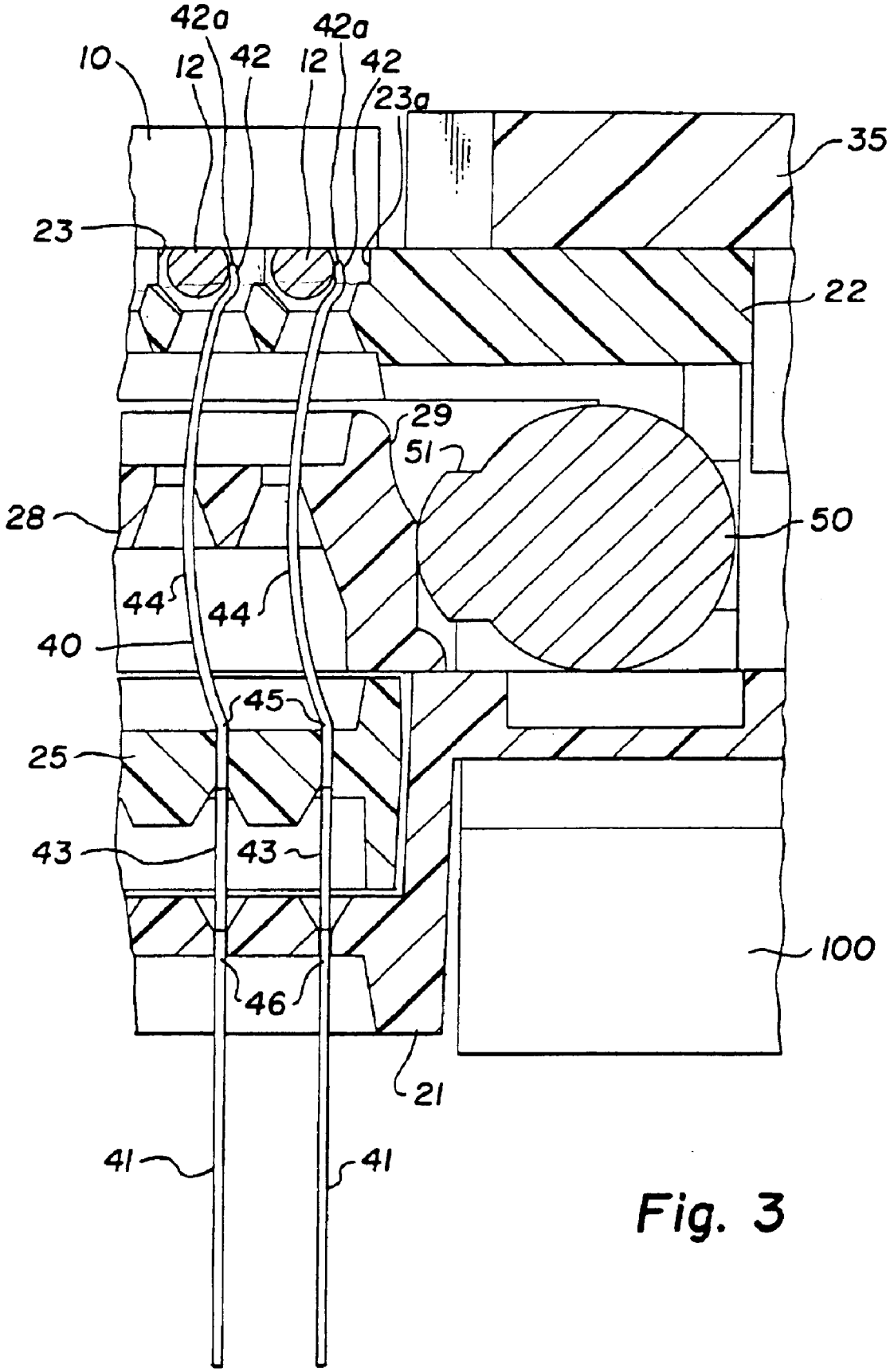
FIG. 3 is a partial sectional view of the mounting housing of FIG. 1 taken along lines 2—2 showing the position of the contact fingers when a ball grid array has been inserted in a socket and the socket is in the closed position.
Figure 4:
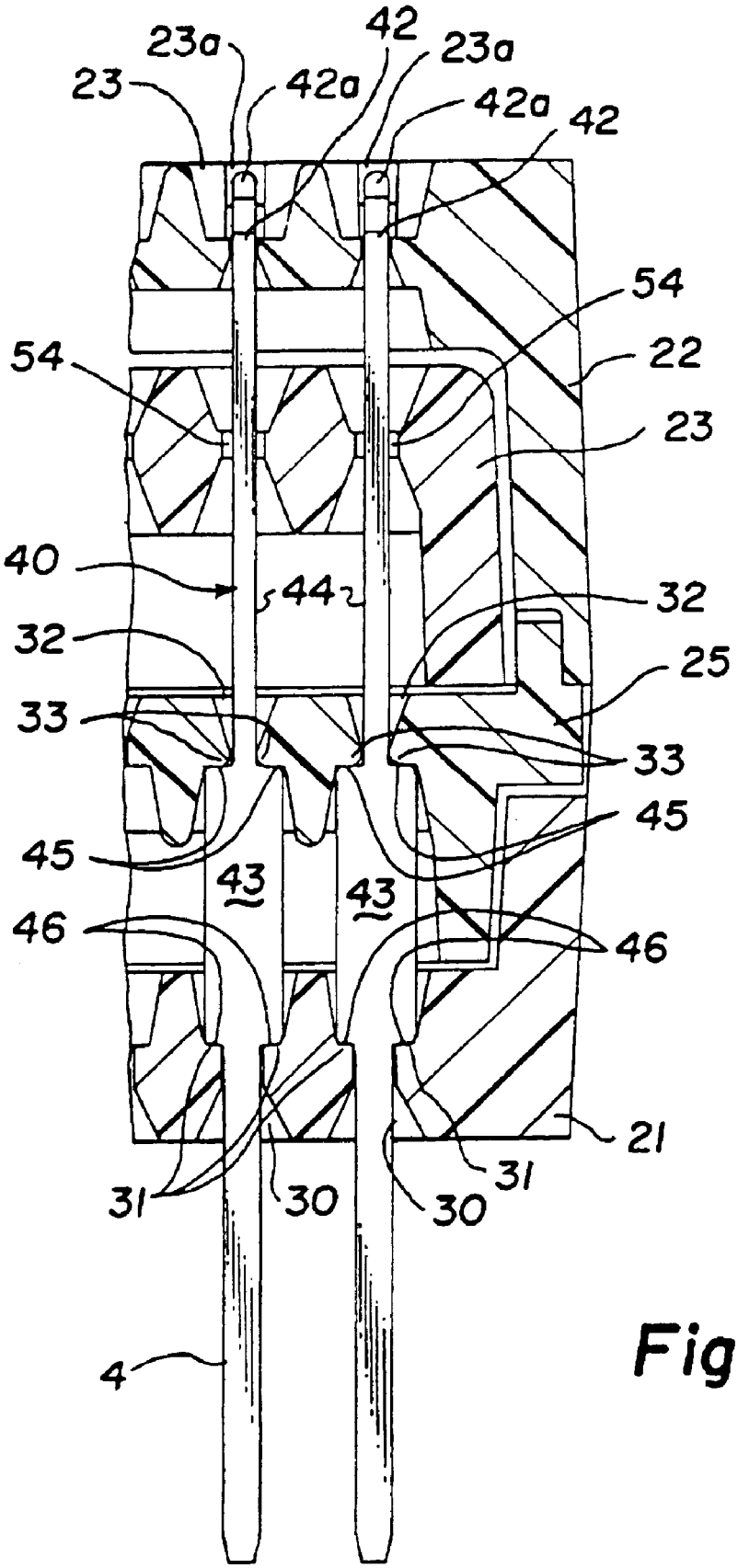
FIG. 4 is a partial sectional view of the mounting housing of FIG. 1 taken along lines 4—4 of FIG. 2.

In the [preferred] embodiment *of FIG. 1A* each window 23 has a small recess 23a which accommodates the end portion 42 of contact finger 40. As illustrated in FIGS. 2, 3 and 4 bending plate 28 is positioned between trap plate 25 and support member 22 but is free for reciprocal movement laterally with respect to the housing. Since mid-sections 43 of contact fingers 40 are securely anchored between the base member 21 and trap plate 25, lateral movement of bending plate 28 causes corresponding lateral movement of the free end portions 42 of contact fingers 40.

Rotatable cam 50 extends horizontally through the mounting housing adjacent one end surface 29 of the bending plate. The cam 50 is secured in housing 100 on one end by retainer 53. The opposite end of the cam 50 is controlled by lever 52. A lobe 51 extending from cam 50 is moved into contact with end surface 29 of plate 28 when lever 52 is moved in a first direction. Thus, rotation of a cam 50 (counter-clockwise as shown in FIG. 2) cams bending plate 28 in the same direction (to the left as shown in FIG. 2). Movement of bending plate 22 thus forces the free end portions 42 in the same direction, withdrawing them from recesses 23a and causing them to laterally traverse the window 23. It should be recognized that a rotating cam 50 is the presently preferred means for moving plate 28. Other means such as wedge plates, ratchets, plungers and rack-and-pinion arrangements, to name a few, may be designed to perform the relative movement function of the cam. Thus the terms "cam" and "cam plate" are used herein to describe any mechanical arrangement which moves the upper portion 44 of the contact fingers laterally with respect to the support member 22.

The position of the upper portions 44 of contact fingers 42 in the housing in the open condition is illustrated in FIG. 2. In this position the contact fingers 40 are either relaxed or forced into the open position by bending plate 28. If desired, a spring (not shown) may be positioned between the housing 100 and the end of the plate 28 opposite end 29 to ensure that the free end portions 42 are withdrawn into recesses 23a. Accordingly, a ball grid array device may be positioned with the [ball terminals] *terminal balls* 12 depending into windows 23 by simply positioning the ball grid array in the proper position. Since the free end portions 42 are withdrawn into recesses 23a, the [ball terminals] *terminal balls* 12 simply depend into window[s] 23. Thus, no pressure of any sort is applied to any portion of the ball grid array device 10 or the depending [ball terminals] *terminal balls* 12. Furthermore, no force is applied (other than gravitational) to any portion of the socket by the electronic device package or the [ball terminals] *terminal balls*. When the ball grid array device is securely in place, lever 52 is moved to rotate cam 50 and urge lobe 51 into contact with the end surface 29 of bending plate 28. As plate 28 is moved (to the left as shown in FIG. 2) by lobe 51, the free end portions 42 of the contact fingers 40 uniformly and simultaneously move toward and into contact with the [ball terminals] *terminal balls* 12 depending into the windows 23.

Figure 5:
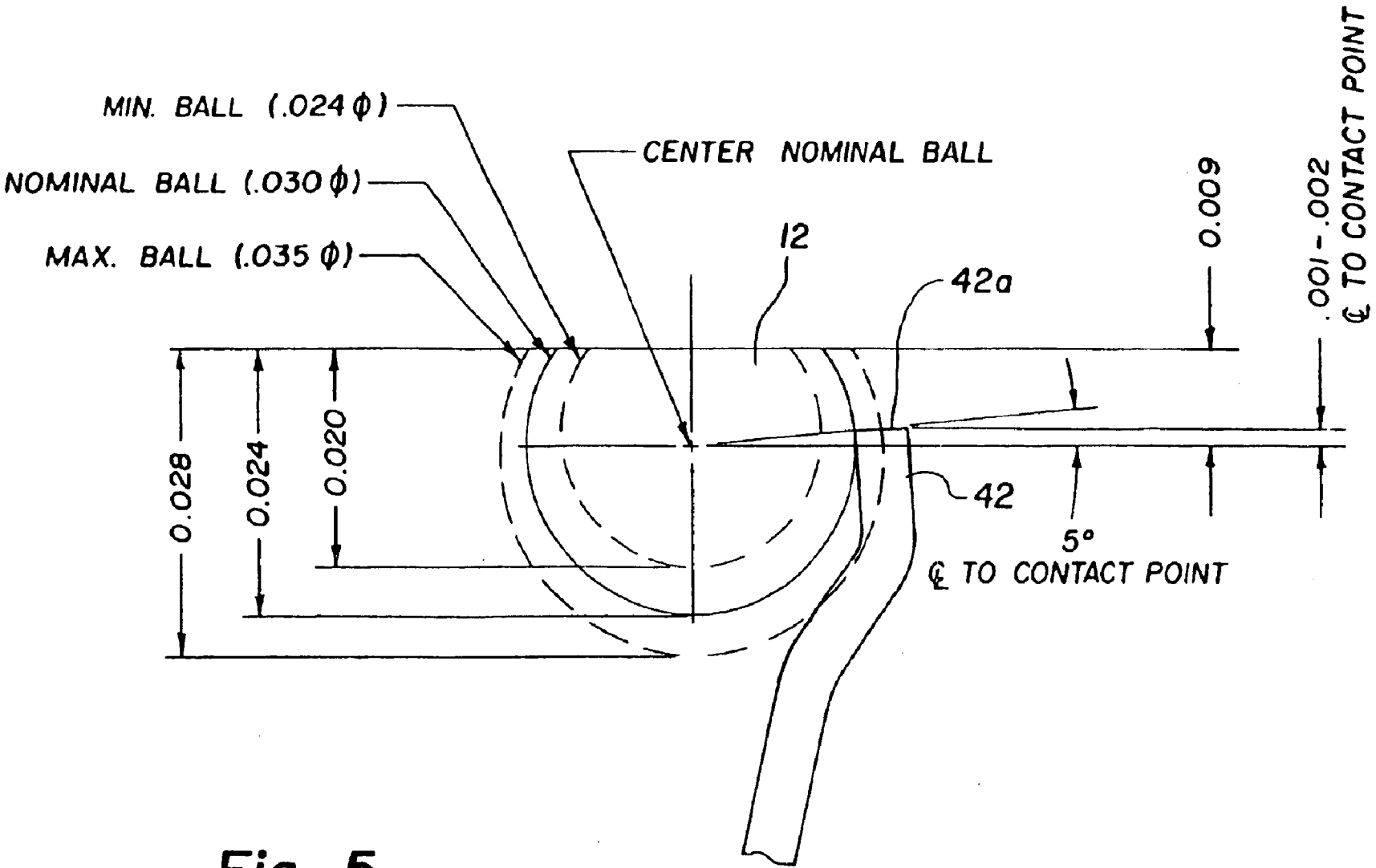
FIG. 5 is a diagrammatic representation of the relationship between the end portion of a contact finger as used in the invention and terminal balls of various nominal ball sizes extending from the surface of ball grid array device.

As best shown in FIG. 1A and graphically illustrated in FIG. 5, the free end portions 42 of contact fingers 40 are positioned to extend into windows 23 near surface 24 but do not extend above surface 24. Furthermore, the free end portions 42 are bent so that the extreme end 42a deviates from the vertical axis of the pin 40 toward the [ball] terminal *ball* 12 to form a cup or hook at the extreme end 42a of the contact finger 40. As illustrated in FIG. 5, the extreme end 42a of free end portion 42 must extend above the centerline of the [ball] terminal *ball* 12. For representative purposes, FIG. 5 illustrates the relative position of extreme end 42a in contact with a [ball] terminal *ball* when the nominal ball size is 0.030 inch. Nominal ball sizes of 0.030 inch may vary from about 0.035 to about 0.024 inch in diameter. Thus the point of contact on the ball may vary slightly with variations in ball size. However, as shown in FIG. 5, where the extreme end 42a of free end portion 42 extends at least 0.001 to about 0.002 inch above the extended centerline (the horizontal line passing through the center of the [ball] terminal *ball* 12), the point of contact between the extreme end 42a of contact finger 40 will be approximately five degrees (5°) above the extended centerline of the [ball] terminal *ball* 12. Thus, since the ball grid array device 10 is trapped and prevented from horizontal movement by spacers 35, pressure exerted against the [ball terminals] *terminal balls* 12 by extreme ends 42a of the contact fingers 40 have both a lateral force component and a small downward force component. The ball grid array device 10 is thus trapped and secured against the top face 24 of the support member 22 by the lateral and downward pressure exerted on the [ball terminals] *terminal balls* 12 by contact fingers 40.

The relative positions of the [Components] *components* of the mounting housing and the ball grid array device when the housing is in the closed condition is illustrated in FIG. 3. Note that lobe 51 on cam 50 has forced plate 28 to the left as shown in FIG. 3. The extreme ends 42a of contact fingers 40 have moved in the same direction until they contact the surface of [ball terminals] *terminal balls* 12. As the bending plate 28 moves further to the left, the mid-section 44 of each contact finger 40 is bowed until a contact pressure of approximately thirty-five (35) grams is applied to each [ball] terminal *ball*. Since the extreme end 42a of the contact finger 40 is above the centerline of each of [ball] terminal *ball* 12, this pressure securely locks the entire ball grid array device adjacent the top surface 24 of the mounting housing and each contact finger 40 is in electrical contact with a [ball] terminal *ball* 12 for electrical function testing, etc. However, a pressure in the range of about thirty-five (35) grams is insufficient to damage or dislodge the ball terminals 12.

After testing, burn-in or other procedures have been applied to the ball grid array device 10, the device is released by merely moving lever 52 in the opposite direction, permitting the contact fingers 40 (and springs, if included) to urge plate 28 in the opposite direction and permitting the extreme ends 42a to withdraw into recesses 23. The apparatus of the invention therefore provides a totally zero insertion force socket for mounting ball grid array devices for testing and burn-in. The test device may be simply positioned on the top face of the mounting housing by gravity. No force of any sort is applied to the device package or the [ball terminals] *terminal balls* 12 during insertion or removal.

In the embodiment discussed in detail hereinabove, the bending plate 28 is cammed laterally to cause the free ends 42 of the contact fingers 40 to move into contact with the terminal balls 12. It will be recognized, however, that other arrangements may be employed to move the terminal balls 12 with respect to free ends 42 of the contact fingers.

In the embodiment illustrated in FIGS. 6 and 7 the bending plate 28 is maintained in a fixed position and the top support member 22 moved laterally to simultaneously bring the ball terminals 12 into physical contact with the free ends 42 of the contact fingers. In this embodiment, the upper portion 44 of each contact finger 40 extends through an aperture 54 in bending plate 28. The apertures 54 are positioned with respect to the apertures 32 to bias the free ends 42 of the contact finger in a direction which is offset with respect to apertures 32. In the embodiment shown in FIGS. 6 and 7, the contact fingers are reverse-curved in the section which passes through the bending plate 28 and the apertures 54 in the bending plate 28 are positioned to bias the ends 42 in the direction of curvature.

It will be observed that the free ends 42 rest in the recesses 23a in windows 23 when the socket is in the open position. However, when the top support member 22 is moved (to the right as shown in FIG. 7), the ball terminals are simultaneously brought into contact with the free ends 42a of the contact fingers 42 as described hereinabove in connection with the embodiment wherein the bending plate 28 is cammed to move the contact fingers. Other arrangements for effecting the desired relative movement will become apparent to those skilled in the art in view of the foregoing.

When the socket is in the closed position, the extreme ends 42a of the contact fingers 40 each exert a lateral and downward force on the ball terminal at approximately five degrees (5°) above its centerline. The pressure exerted by each individual finger is limited so that there is no risk of damage to the ball terminals 12. Likewise, when the contact fingers 40 are withdrawn (or the top plate moved) to the open position, the ball grid array device 10 may be removed simply by gravity or with a vacuum pencil or the like. It is particularly noteworthy that the invention not only permits total zero insertion force and withdrawal force, no pressure whatsoever is ever applied to the ball grid array device except to the terminal balls 12. In fact, the entire top surface of the ball grid array device is exposed since no lid or cover is employed. Cooling air may be circulated thereover or a heat sink may be applied thereto. Furthermore, since test devices may be loaded simply by vertical movement by gravity, the test apparatus of the invention may be easily loaded and unloaded by automated equipment.

It should be particularly noted that in all configurations of the invention, all reactive forces caused by engagement between the device and the socket are contained within the body of the socket housing and not transmitted to the burn-in board. Note that opening (or closing) the socket by moving the ends 42 of the contact fingers with respect to the ball terminal balls 12 can involve substantial force. For example, a typical contact force requirement is approximately one (1) ounce of force exerted on each terminal ball 12 by each finger 42. In device packages having one thousand terminal balls or more, the cumulative contact force applied is greater than sixty-two (62) pounds. This constitutes a substantial force with which to reckon since a burn-in board or the like may include a multitude of sockets and each socket is repeatedly loaded and unloaded. However, since the contact fingers are moved simultaneously with respect to the ball terminals by rotation of a cam, all opening and closing forces (and their opposing reactive forces) are contained within the socket. Furthermore, the fingers each individually contact only one ball terminal. Thus only about one ounce of force is applied to any one terminal. No substantial force is ever applied to the device package or the supporting burn-in board. Instead, all forces (and reactive forces) applied are contained within the socket housing.

It will be readily recognized that the materials used for manufacture of the mounting housing of the invention may be varied as desired, depending upon the application. Similarly, the physical size and shape of the components may be arranged to accommodate any particular ball grid array device. For example, the contact fingers 40 are shown as axially elongated metal strips as may be cut or stamped from flat ribbon stock. However, the fingers 40 could be formed from wire stock and may be formed into various configurations without departing from the principles of the invention. Likewise, the fingers may be anchored in the socket as desired by any suitable means. If the socket is to be used for burn-in purposes, heat resistant materials, of course, should be employed. The design is particularly attractive for use in hostile environments since, in its preferred embodiment, very few moving parts are employed and the opening and closing functions can be readily automated. Thus the preferred structure is extremely reliable and functional in extended repetitive use.

From the foregoing it will be recognized that the principles of the invention may be employed in various arrangements to obtain the benefit of the many advantages and features disclosed. It is to be understood, therefore, that even though numerous characteristics and advantages of the invention have been set forth together with details of the structure and function of the invention, this disclosure is to be considered illustrative only. Various changes and modifications may be made in detail, especially in matters of size, shape and arrangements of parts, without departing from the spirit and scope of the invention as defined by the appended claims.

What is claimed:

1. Apparatus for mounting a ball grid array device comprising:

(a) a support member having a support face with a plurality of windows therein arranged in a pattern to correspond with and receive terminal balls depending from one face of a ball grid array device when said ball grid array device is positioned on the support face of said support member;

(b) a base member;

(c) a bending plate having apertures therein substantially corresponding with said windows positioned between said base member and said support member and adapted for lateral movement with respect to said support member;

(d) a plurality of elongated contact members anchored in said base member, each having an interconnection end and a free end portion disposed on opposite sides of a central section with said central section projecting through an aperture in said bending plate and said free end portion positioned in a window in said support member; and (e) a cam adapted to move the position of said bending plate laterally with respect to said support member and thereby urge said free end portions into contact with said terminal balls between the centerline thereof and the face from which they depend.

2. Apparatus as defined in claim 1 wherein said free end portion of each of said contact members has a generally central axis and the extreme end of said end portion is deviated from said generally central axis.

3. Apparatus as defined in claim 2 wherein each said extreme end portion extends into a window in the support member but does not extend through said window.

4. Apparatus as defined in claim 1 wherein said cam contacts and moves said bending plate.

[5. Apparatus as defined in claim 1 wherein said cam contacts and moves said support member.]

6. Apparatus as defined in claim 4 further comprising spring means to urge said bending plate laterally with respect to said support member.

7. Apparatus as defined in claim [5] *1* further comprising spring means to urge said support member laterally with respect to said bending plate.

8. Apparatus as defined in claim 2 wherein the extreme end of said free end portion of each of said contact members extends into a window in said support member a sufficient distance to contact a [ball] terminal *ball* positioned in said window between the center of the [ball] terminal *ball* and the face of the device from which such [ball] terminal *ball* depends.

9. Apparatus as defined in claim 1 further comprising spacers [removeably] *removably* affixed adjacent said support face to at least partially define the periphery of a ball grid array device to be positioned on said support face.

10. Apparatus for mounting a ball grid array device comprising:

(a) a support member having a support face with a plurality of windows therein arranged in a pattern to correspond with and receive [ball terminals] *terminal balls* depending from the face of a ball grid array device when said ball grid array device is positioned on the support face of said support member;

(b) a base member;

(c) biasing means having apertures therein substantially corresponding with said windows positioned between said base member and said support member;

(d) a plurality of elongated contact members anchored in said base member, each having an interconnection end and a free end portion disposed on opposite sides of a central section with said central section projecting through an aperture in said biasing means and said free end portion defining a generally central axis with the extreme end portion of said free end portion deviated from said central axis and positioned in a window in said support member; and

[(c)] (*e*) means for moving said free end portions with respect to said window.

11. Apparatus as defined in claim 10 wherein each said extreme end portion extends into a window in the support member but does not extend through said window.

12. Apparatus as defined in claim 10 further comprising spacers [removeably] *removably* affixed adjacent said support face to at least partially define the periphery of ball grid array devices to be positioned on said support face.

13. The combination comprising:

(a) a ball grid array device having a first face and a plurality of terminal balls depending from said first face in a predetermined pattern, each of said [ball terminals] *terminal balls* defining a geometric center spaced from said first face; and (b) mounting apparatus comprising:

(i) a support member having a support face with a plurality of windows therein arranged in a pattern to correspond with and receiving said terminal balls depending from said first face of said ball array device;

(ii) a base member;

(iii) a bending plate having apertures therein substantially corresponding with said windows positioned between said base member and said support member; and (iv) a plurality of elongated contact members, each having an interconnection end and a free end portion disposed on opposite sides of a central section with said central section projecting through an aperture in said bending plate and said free end portion positioned in one of said windows in said support member and terminating between said first face of said ball grid array and the geometric center of a terminal ball.

14. The combination defined in claim 13 wherein said free end portion of each of said contact members has a generally central axis and the extreme end of said end portion is deviated from said generally central axis.

15. The combination defined in claim 14 wherein each said extreme end portion extends into a window in the support member but does not extend through said window.

16. The combination defined in claim 13 including means for moving said free end portions with respect to said windows.

17. The combination defined in claim 16 wherein said means for moving comprises a rotatable cam adjacent said bending plate which, when rotated, coacts with said bending plate to move said plate laterally with respect to said support member.

18. The combination defined in claim 17 wherein said means for moving includes a spring positioned to urge said bending plate laterally with respect to said support member.

19. The combination defined in claim 16 wherein said means for moving comprises a rotatable cam adjacent said support member which, when rotated, coacts with said support member to move said support member laterally with respect to said bending plate.

20. The combination defined in claim 19 wherein said means for moving includes a spring positioned to urge said support means laterally with respect to said bending plate.

21. Apparatus for mounting a ball grid array device comprising:

(a) a support member having a support face with a plurality of windows therein arranged in a pattern to correspond with and receive terminal balls depending from one face of a ball grid array device when said ball grid array device is positioned on the support face of said support member;

(b) a base member;

(c) a bending plate having apertures therein substantially corresponding with said windows positioned between said base member and said support member and adapted for lateral movement with respect to said support member;

(d) a plurality of elongated contact [member] *members* anchored in said base member, each having an interconnection end and a free end portion disposed on opposite sides of a central section with said central section projecting through an aperture in said bending plate and said free end portion positioned in a window in said support member; and

[(c)] (*e*) a cam adapted to move the position of said bending plate laterally with respect to said support member and thereby move said free end portions within said windows.

22. Apparatus for mounting a ball grid array device comprising:

(a) a support member having a support face with a plurality of windows therein arranged in a pattern to correspond with and receive [ball terminals] *terminal balls* depending from the face of a ball grid array device when said ball grid array device is positioned on the support face of said support member;

(b) a base member;

(c) biasing means having apertures therein substantially corresponding with said windows positioned between said base member and said support member;

(d) a plurality of elongated contact members anchored in said base member, each having an interconnection end and a free end portion disposed on opposite sides of a central section with said central section projecting through an aperture in said biasing means and said free end portion having an extreme end portion thereon positioned in a window in said support member; and

[(c)] (*e*) means for moving said free end portions with respect to said window.

*23. Apparatus for mounting a ball grid array device, the ball grid array device having terminal balls depending from the ball grid array device, and the apparatus comprising:*

*(a) a support member having a support face, wherein the ball grid array device is positioned on said support face of said support member;*

*(b) a base member;*

*(c) a bending plate having apertures therein substantially corresponding with the terminal balls, said bending plate positioned between said base member and said support face of said support member and adapted for lateral movement with respect to said support member;*

*(d) a plurality of elongated contact members anchored in said base member, each having an interconnection end and a face end portion disposed on opposite sides of a central section with said central section projecting through an aperture in said bending plate, and said free end portion positioned to extend adjacent to a respective one of the terminal balls of the ball grid array device; and*

*(e) a cam adapted to move the position of said bending plate laterally with respect to said support member and thereby urge said free end portions into contact with the terminal balls.*

*24. Apparatus as defined in claim 23 wherein said free end portion of each of said contact members has a generally central axis and the extreme end of said end portion is deviated from said generally central axis.*

*25. Apparatus as defined in claim 24 wherein each said extreme end portion extends into an open space in said support member but does not extend through said open space in said support member.*

*26. Apparatus as defined in claim 23 wherein said cam contacts and moves said bending plate.*

*27. Apparatus as defined in claim 26 further comprising spring means to urge said bending plate laterally with respect to said support member.*

*28. Apparatus as defined in claim 23 further comprising spring means to urge said support member laterally with respect to said bending plate.*

*29. Apparatus as defined in claim 24 wherein the extreme end of said free end portion of each of said contact members extends beneath a face of the ball grid array device from which said terminal balls depend a sufficient distance to contact a terminal ball between the center of the terminal ball and the face of the device from which such terminal ball depends.*

*30. Apparatus as defined in claim 23 further comprising spacers removeably affixed adjacent said support face to at least partially locate the periphery of a ball grid array device relative to said support member.*

*31. Apparatus for mounting a ball grid array device, the ball grid array device having terminal balls depending from one face of the ball grid array device, and said apparatus comprising:*

*(a) a support member having a support face on which said ball grid array device is located relative to said support member;*

*(b) a base member;*

*(c) biasing means having apertures therein substantially corresponding with the locations of said terminal balls;*

*(d) a plurality of elongated contact members anchored in said base member, each having an interconnection end and a free end portion disposed on opposite sides of a central section with said central section projecting through an aperture in said biasing means and said free end portion defining a generally central axis with the extreme end portion of said free end portion deviated from said central axis and positioned adjacent a respective one of said terminal balls of said ball grid array device; and*

*(e) means for moving said free end portions with respect to said support member.*

*32. Apparatus as defined in claim 31 wherein each said extreme end portion extends into an open space in said support member but does not extend through said open space in said support member.*

*33. Apparatus as defined in claim 31 further comprising spacers removably affixed adjacent said support face to at least partially locate the periphery of ball grid array devices relative to said support face.*

*34. The combination comprising:*

*(a) a ball grid array device having a first face and a plurality of terminal balls depending from said first face in a predetermined pattern, each of said terminal balls defining a geometric center spaced from said first face; and*

(*b*) *mounting apparatus comprising:*

(*i*) *a support member adjacent to which said ball grid array device is located;*

(*ii*) *a base member;*

(*iii*) *a bending plate having apertures therein substantially corresponding with said terminal balls positioned between said base member and said support member; and*

(*iv*) *a plurality of elongated contact members, each having an interconnection end and a free end portion disposed on opposite sides of a central section with said central section projecting through an aperture in said bending plate and said free end portion positioned adjacent to a respective one of said terminal balls and terminating between said first face of said ball grid array and the geometric center of said respective one of said terminal balls.*

*35. The combination defined in claim 34 wherein said free end portion of each of said contact members has a generally central axis and the extreme end of said end portion is deviated from said generally central axis.*

*36. The combination defined in claim 35, wherein each said extreme end portion extends into an open space in said support member but does not extend through said open space in said support member.*

*37. The combination defined in claim 34 including means for moving said free end portion with respect to the terminal balls depending from the face of the ball grid array device.*

*38. The combination defined in claim 37 wherein said means for moving comprises a rotatable cam adjacent said bending plate which, when rotated, coacts with said bending plate to move said plate laterally with respect to said support member.*

*39. The combination defined in claim 38 wherein said means for moving includes a spring positioned to urge said bending plate laterally with respect to said support member.*

*40. The combination defined in claim 37 wherein said means for moving comprises a rotatable cam adjacent said support member which, when rotated, coacts with said support member to move said support member laterally with respect to said bending plate.*

*41. The combination defined in claim 40 wherein said means for moving includes a spring positioned to urge said support means laterally with respect to said bending plate.*

*42. Apparatus for mounting a ball grid array device, the ball grid array device having terminal balls depending from the ball grid array device, and said apparatus comprising:*

(*a*) *a support member having at least one support surface against which the ball grid array device is disposed to locate the ball grid array device in a desired position relative to said support member;*

(*b*) *a base member;*

(*c*) *a bending plate having apertures therein substantially corresponding with the terminal balls, said bending plate positioned between said base member and said support member and adapted for lateral movement with respect to said support member;*

(*d*) *a plurality of elongated contact members anchored in said base member, each having an interconnection end and a free end portion disposed on opposite sides of a central section with said central section projecting through an aperture in said bending plate and said free end portion positioned adjacent to a respective one of the terminal balls; and*

(*e*) *a cam adapted to move the position of said bending plate laterally with respect to said support member and thereby move said free end portions against respective ones of the terminal balls.*

*43. Apparatus for mounting a ball grid array device, the ball grid array device having terminal balls depending from one face of the ball grid array device, and said apparatus comprising:*

(*a*) *a base member;*

(*b*) *a support member having a support face against which the ball grid array device is located, with said terminal balls extending toward said base member;*

(*c*) *biasing means having apertures therein substantially corresponding with said terminal balls, said biasing means positioned between said base member and said support face of said support member;*

(*d*) *a plurality of elongated contact members anchored in said base member, each having an interconnection end and a free end portion disposed on opposite sides of a central section with said central section projecting through an aperture in said biasing means and said free end portion having an extreme end portion thereof positioned adjacent respective ones of the terminal balls; and*

(*e*) *means for moving said free end portions with respect to said terminal balls.*

*44. Apparatus as defined in claim 43, wherein said terminal balls extend downward from said support face, and said base member is disposed beneath said support face.*

*45. Apparatus as defined in claim 43 wherein each said extreme end portion extends into an open space in said support member but does not extend through said open space in said support member.*

*46. Apparatus for mounting a ball grid array device, the ball grid array device having an array of terminal balls depending from the ball grid array device, and said apparatus comprising:*

(*a*) *a support member having a support face, wherein the ball grid array device is positioned on said support face such that at least a portion of said support face supportingly engages the ball grid array device;*

(*b*) *a base member;*

(*c*) *a bending plate having apertures therein substantially corresponding in relative relation with the terminal balls depending from the ball grid array device and adapted for lateral movement with respect to said support member;*

(*d*) *a plurality of elongated contact members anchored in said base member, each having an interconnection end and a free end portion disposed on opposite sides of a central section, with said central section projecting through a respective one of said apertures in said bending plate and said free end portion positioned to extend adjacent to a respective one of the terminal balls of the ball grid array device; and*

(*e*) *a cam adapted to move the position of said bending plate laterally with respect to said support member and thereby urge said free end portions of said elongated contact members into contact with the respective ones of the terminal balls.*

*47. Apparatus as defined in claim 46 wherein said free end portion of each of said contact members has a generally central axis and the extreme end of said end portion is deviated from said generally central axis.*

*48. Apparatus as defined in claim 46 wherein the extreme end of said free end portion of each of said contact members extends a sufficient distance to contact a respective terminal*

*ball between the center of the terminal ball and the face of the device from which such terminal ball depends.*

*49. Apparatus as defined in claim 46 further comprising spacers disposed adjacent said support face to at least partially locate a periphery of the ball grid array device in a lateral position relative to said on said support face.*

*50. Apparatus for use with a ball grid array device of the type having an array of terminal balls extending therefrom, said apparatus comprising:*

*a support member having a support face for supporting thereon the ball grid array device, said support member having a stop for engaging the ball grid array device to locate the ball grid array device with respect to said support member;*

*a bending member having a plurality of apertures generally registered with the terminal balls when the ball grid array device is located with respect to said support member;*

*a base member;*

*a plurality of elongated contact members secured in said base member and extending from said base member, through respective ones of said apertures in said bending member and toward the ball grid array device, said elongated contact members each having contact ends extending so as to be positioned to a side of a respective terminal ball of said ball grid array device; and*

*a cam adapted for moving at least one of said bending member and said support member to thereby move the contact ends of said elongated contact members sideways into contact with respective terminal balls.*

*51. The apparatus of claim 50, wherein said support member is positioned over said bending member, and said bending member is positioned over said base member, and said contact ends of said elongated contact members extend into an area occupied by said support member, whereby when the ball grid array device rests on said support face and is engaged with said stop, said contact ends of said elongated contact members are adjacent respective terminal balls of the ball grid array device.*

*52. The apparatus of claim 51, wherein said support member includes in said area occupied by said support member, an array of windows, and each contact end of said contact members extends into a respective one of said windows.*

*53. Apparatus as defined in claim 50 wherein said free end portion of each of said contact members has a generally central axis and the extreme end of said end portion is deviated from said generally central axis.*

*54. Apparatus as defined in claim 50 wherein said cam contacts and moves only one of said bending member and said support member, and said apparatus further comprising spring means to urge said one of said bending plate and said support plate laterally with respect to the other of said bending plate and said support member.*

*55. Apparatus as defined in claim 50 herein the extreme end of said free end portion of each of said contact members extends a sufficient distance to contact a respective terminal ball between the center of the terminal ball and the face of the device from which such terminal ball depends.*

*56. Apparatus as defined in claim 50, wherein said stop comprises a spacer disposed adjacent said support face to at least partially locate a periphery of the ball grid array device laterally relative to with respect to said support face.*

* * * * *